United States Patent
Penney

(10) Patent No.: US 10,366,742 B1
(45) Date of Patent: Jul. 30, 2019

(54) MEMORY DEVICE PARALLELIZER

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/891,356

(22) Filed: Feb. 7, 2018

(51) Int. Cl.
| | |
|---|---|
| *G06F 13/16* | (2006.01) |
| *G11C 11/4096* | (2006.01) |
| *G11C 7/22* | (2006.01) |
| *G11C 7/10* | (2006.01) |
| *G11C 11/4094* | (2006.01) |
| *G06F 13/40* | (2006.01) |

(52) U.S. Cl.
CPC ...... *G11C 11/4096* (2013.01); *G06F 13/1689* (2013.01); *G06F 13/4063* (2013.01); *G11C 7/106* (2013.01); *G11C 7/1012* (2013.01); *G11C 7/1045* (2013.01); *G11C 7/1063* (2013.01); *G11C 7/1066* (2013.01); *G11C 7/1087* (2013.01); *G11C 7/222* (2013.01); *G11C 11/4094* (2013.01)

(58) Field of Classification Search
CPC .................................................. G06F 13/1684
USPC ................................................. 365/221, 220
See application file for complete search history.

(56) References Cited

U.S. PATENT DOCUMENTS

| | | | |
|---|---|---|---|
| 5,598,156 A | 1/1997 | Hush et al. | |
| 5,767,798 A | 6/1998 | Won | |
| 7,478,181 B2 * | 1/2009 | Perego | G06F 13/1684 365/221 |
| 2002/0057614 A1 | 5/2002 | Kanazashi | |
| 2012/0198109 A1 | 8/2012 | Cheng | |
| 2014/0223045 A1 | 8/2014 | Sharma et al. | |

OTHER PUBLICATIONS

PCT/ US2018/055866—International Search Report and Written Opinion dated Jan. 28, 2019.

* cited by examiner

*Primary Examiner* — Jason Lappas
(74) *Attorney, Agent, or Firm* — Fletcher Yoder, P.C.

(57) ABSTRACT

Memory device and methods for controlling the memory device include an input buffer of the memory device receives input data from external to the memory device and outputs serial data. A serial shift register that shifts in the serial data and to output the serial data in a parallel format as parallel data. A parallel register that receives the parallel data from the serial shift register and buffered data directly from the input buffer. The parallel register that passes the parallel data and the buffered data to a data write bus to be stored memory banks of the memory device. Serial-to-parallel conversion circuitry controls loading of the parallel register from the serial shift register and the input buffer. The serial-to-parallel conversion circuitry utilizes a first loading signal to load the buffered data into the parallel register and a second loading signal to load the parallel data into the parallel register.

20 Claims, 8 Drawing Sheets

MEMORY DEVICE PARALLELIZER

BACKGROUND

Field of the Present Disclosure

Embodiments of the present disclosure relate generally to the field of semiconductor devices. More specifically, embodiments of the present disclosure relate to a memory device parallelizer that takes incoming serial data and converts it to parallel data for storage in memory banks of the memory device.

Description of Related Art

Semiconductor devices (e.g., memory devices) utilize timing with phase shifts of data signals, data strobes, and/or other signals to perform operations. For memory devices, write data may be strobed into the memory device in a serial stream. This data is converted from the serial stream to parallel bits to be passed to memory banks in parallel. This conversion is completed using serial-to-parallel conversion circuitry. However, the serial-to-parallel conversion circuitry may consume a significant amount of power due to an amount of flip flops and clocking signals (with significant loading) used.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, write data may be strobed into a memory device in a serial stream. This data is converted in serial-to-parallel conversion circuitry from the serial stream to parallel bits to be passed to memory banks via a parallel bus. Furthermore, a propagation delay of an input buffer latch may be longer than shift register stages used to shift the serial data into the parallel buffer. As discussed below, this propagation delay creates a timing race for consecutive write operations. Moreover, the serial-to-parallel conversion circuitry may consume a significant amount of power due to the flip flops and clocking signals (with significant loading) used. Furthermore, the serial-to-parallel conversion circuitry may also alter bit ordering in the serial-to-parallel conversion for different burst lengths. In other words, when a burst length is a first length of bits (e.g., 8) the bit ordering may be different than when a burst length is a second length of bits (e.g., 16). Moreover, an optional cyclic redundancy check (CRC) bit may add additional CRC data to the parallel bus in a separate loading of the parallel bus as part of the write operation.

Figure 1:
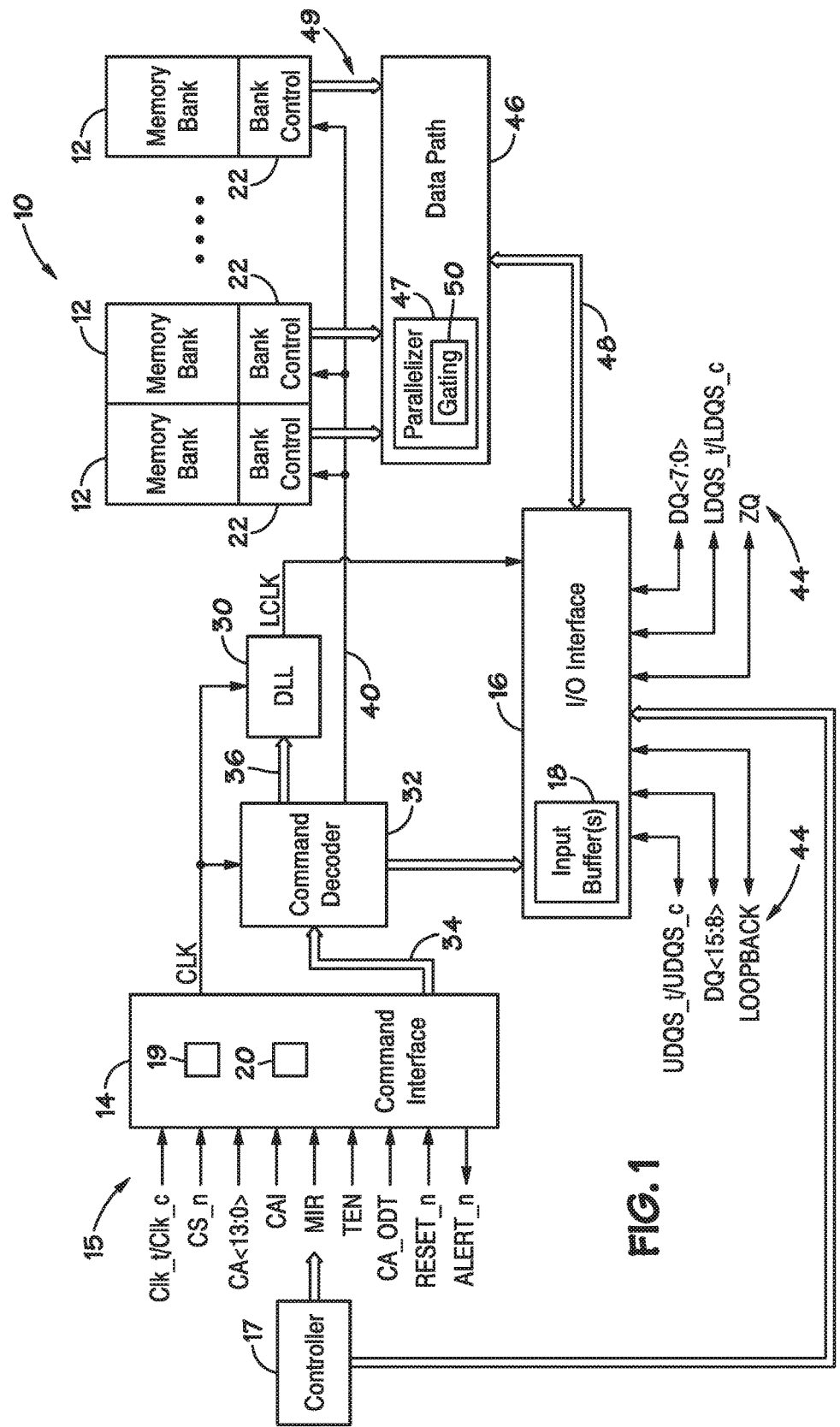
FIG. 1 is a simplified block diagram illustrating certain features of a memory device having gating circuitry in a parallelizer used to convert serial data to parallel data, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMzS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor or controller 17. The IO interface 16 includes one or more input buffers 18 that each buffer incoming data. The processor or controller 17 may provide various signals 15 to the memory device 10 to facilitate the transmission and receipt of data to be written to or read from the memory device 10.

As will be appreciated, the command interface 14 may include a number of circuits, such as a clock input circuit 19 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 19 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as the processor or controller 17. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes multiple bi-directional data buses. Data IO signals, generally referred to as DQ signals, are generally transmitted and received in one or more bi-directional data busses using the input buffer 18. The datapath 46 may include a parallelizer 47 that converts the DQ signals from a serial bus 48 to a parallel bus 49. As discussed below, the parallelizer 47 may include gating circuitry 50 that cuts off signals in the parallelizer 47 to save power during writes using NAND gates and/or multiplexers to cut off loading of a parallel register for the parallel bus 49. The gating circuitry 50 also provides optional bit reordering based on burst length settings for the write operation.

For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
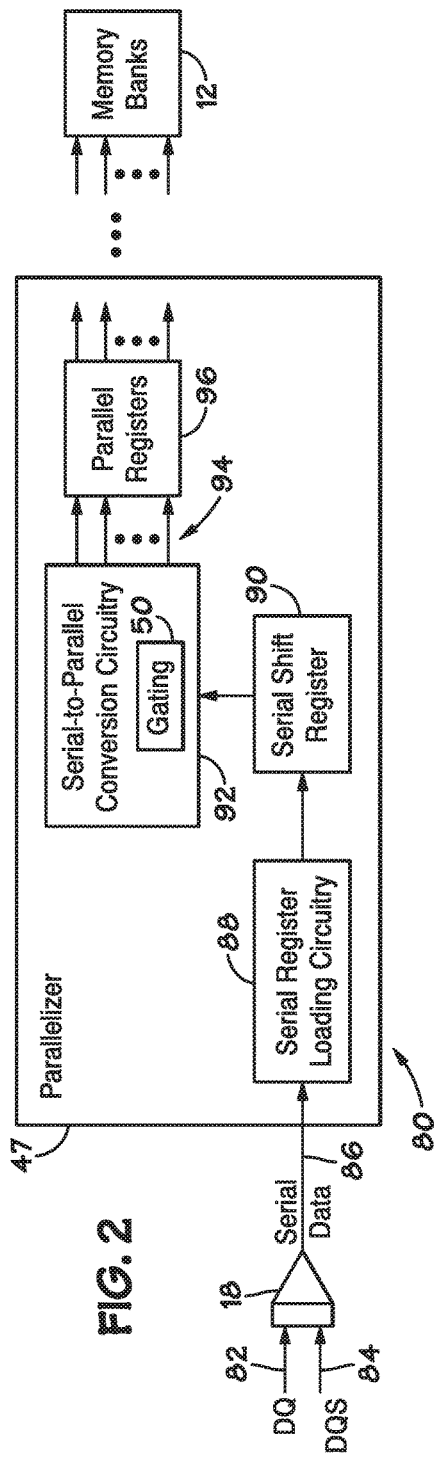
FIG. 2 is a schematic diagram of circuitry that includes the parallelizer of FIG. 1 having serial-to-parallel conversion circuitry, a serial shift register, and a parallel register.

FIG. 2 is a schematic diagram of circuitry 80 that includes the parallelizer 47. As illustrated, the input buffer 18 receives a DQ signal 82 and a DQS signal 84 from the controller 17. In some embodiments, the DQ signal 82 and/or the DQS signal 84 may be amplified or adjusted from an external DQ signal and/or the DQS provided by the controller directly. For example, one or more inverting amplifiers may be included to boost an amplitude of the external DQ signal and/or the DQS to account for loading fanout in the memory device 10. The input buffer 18 buffers serial data 86 from the DQ signal 82 using the DQS signal 84. The serial data 86 is then passed to the parallelizer 47. The parallelizer 47 includes serial register loading circuitry 88 that loads the serial data 86 in a serial shift register 90 that then passes the data into serial-to-parallel conversion circuitry 92 that selectively passes the data as parallel data 94 to parallel registers 96 unless the gating circuitry 50 in the serial-to-parallel conversion circuitry 92 blocks the passing. As previously noted, the gating circuitry 50 saves power by cutting off the parallel registers 96 and/or enables bit reordering of the serial data 86 before shifting the data to the parallel registers 96. The parallel data 94 is eventually stored in the memory banks 12.

Figure 3:
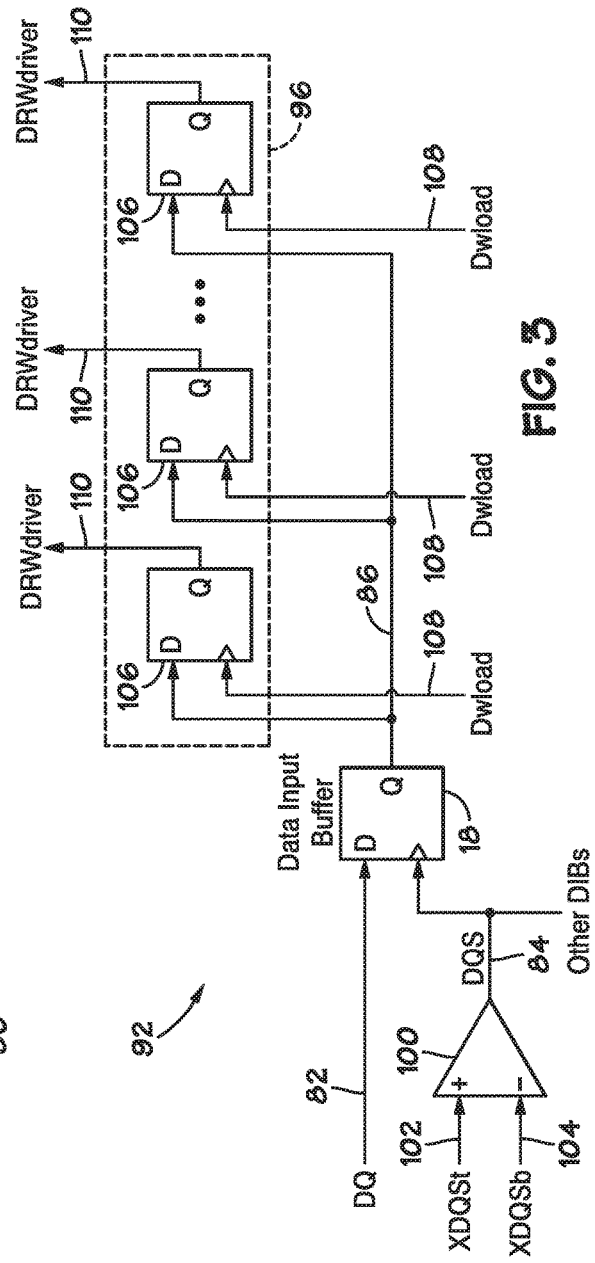
FIG. 3 is a schematic diagram of the serial-to-parallel conversion circuitry of FIG. 2, in accordance with an embodiment.

FIG. 3 is a schematic diagram of an embodiment of the serial-to-parallel conversion circuitry 92. As previously discussed, the input buffer 18 receives the DQ signal 82 and the DQS signal 84. Further, also as previously noted, the DQS signal 84 may be generated using an amplifier 100 from external DQS signals, such as the external DQS true (XDQSt) signal 102 and the external DQS false (XDQSb) signal 104. As illustrated, the DQS signal 84 may be shared with other input buffers in the memory device 10. The input buffer 18 captures the data in the DQ signal 82 on both edges of the DQS signal 84. Data from the DQ signal 82 is passed through the input buffer 18 to the latches 106 of the parallel register 96. The latches 106 use corresponding drive write (DW) load signals 108 to drive parallel data onto a local data read-write (DRW) bus inside the memory device 10 via DRW drivers 110. In some embodiments, the DRW drivers 110 may drive the DRW bus to three different states due to the DRW bus being bi-directionally used for both read and write data. The DRW bus passes the data to be eventually stored in the memory banks 12.

Figure 4:
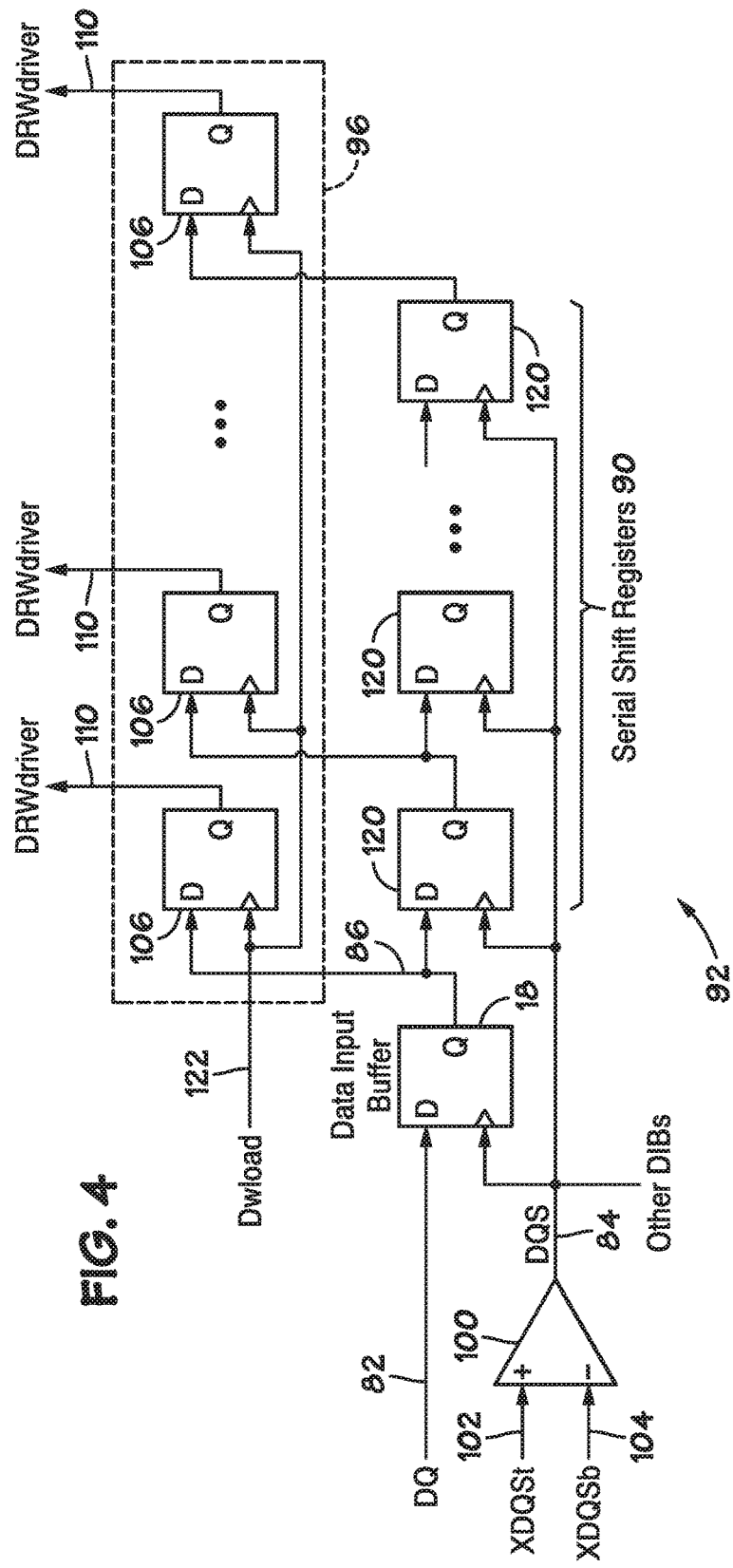
FIG. 4 is a schematic diagram of the serial-to-parallel conversion circuitry of FIG. 2 using the serial shift register of FIG. 2, in accordance with an embodiment.

In the illustrated embodiment, the number of DW load signals 108 used to load data into the parallel register 96 is equal to a number of bits (e.g., 16-bit burst length) provided in the serial data 86 of the DQ signal 82. However, the data may be pre-buffered using the serial shift register 90 to reduce the number of loading signals used. FIG. 4 is a schematic diagram of an embodiment of the serial-to-parallel conversion circuitry 92 utilizing serial shift register 90 as a first-in, first-out buffer for the parallel register 96. As illustrated, the serial shift register 90 serially shifts in data from the input buffer 18 using flip flops 120 that shift data from the DQ signal 82 with each edge of the DQS signal 84. The serial shift register 90 includes a number of bits one less than a number of the number of bits that are loaded into the parallel register 96 from the input buffer 18 since the last bit is shifted from the input buffer 18 to the parallel register 96 directly. For example, if a whole burst length of 16 bits is passed into the parallel register 96 from the input buffer 18, the serial shift register includes 15 flip flops 120. After the last serial data bit (e.g., 16th bit of a 16-bit burst length) has been buffered at the input buffer 18, the last bit is loaded simultaneously with the other bits in the serial shift register 90 into the parallel register 96 using a single DW loading signal 122. Thus, the serial-to-parallel conversion circuitry 92 may utilize a simpler single DW loading signal 202 instead of multiple separate strobes.

Figure 5:
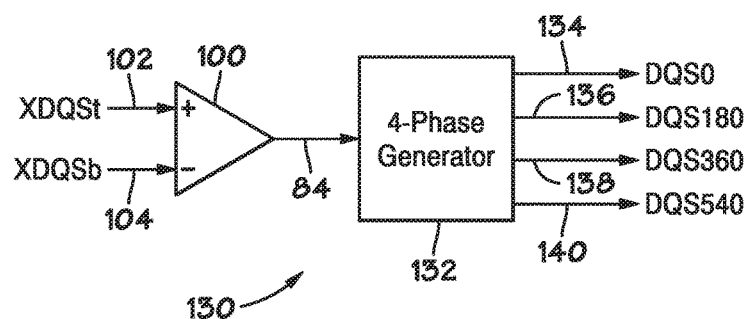
FIG. 5 is a multi-phase generator used to generate multiple phases of clocks each to be used with a corresponding serial-to-parallel conversion circuitry, in accordance with an embodiment.
Figure 6:
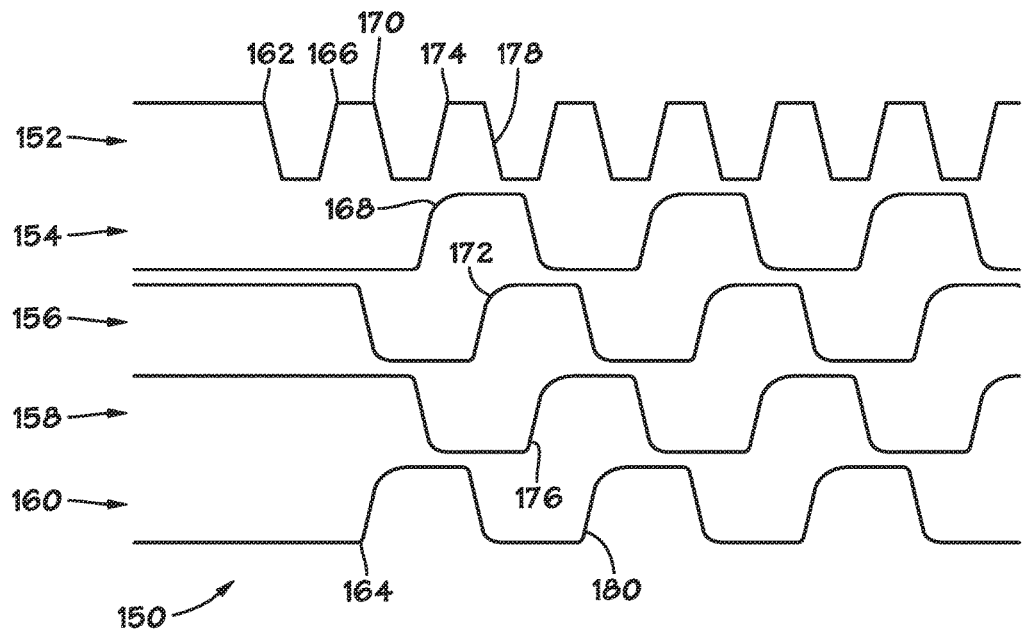
FIG. 6 is a timing diagram of the multiple phases of FIG. 5, in accordance with an embodiment.

In some embodiments, the memory device 10 may utilize multiple phases from the DQS signal 84 at multiple input buffers each operating a lower (e.g., half) frequency of the original DQS signal 84. FIG. 5 illustrates phase dividing circuitry 130 that receives the DQS signal 84 at a 4-phase generator 132 that generates phases 134, 136, 138, and 140 that are each used to shift in data from the DQ signal 82 at corresponding input buffers 18 and corresponding serial shift registers 90 for transfer into the parallel register 96. FIG. 6 is a graph 150 showing waveforms 152, 154, 156, 158, and 160. The waveform 152 corresponds to an embodiment of the DQS signal 84. The waveform 154 corresponds to the phase 134 resulting from the DQS signal 84. The waveform 156 corresponds to the phase 136 resulting from the DQS signal 84. The waveform 158 corresponds to the phase 138 resulting from the DQS signal 84. The waveform 160 corresponds to the phase 140 resulting from the DQS signal 84. As illustrated, the waveform 152 has a first frequency, and the waveforms 154, 156, 158, and 160 have a frequency that is half the frequency of the first frequency.

A falling edge 162 of the waveform 152 causes a rise 164 of the waveform 160. Similarly, a rising edge 166 of the waveform 152 causes a rise 168 of the waveform 154. Likewise, a falling edge 170 of the waveform 152 causes a rise 172 of the waveform 156, and a rising edge 174 of the waveform 152 causes a rise 176 of the waveform 158. A falling edge 178 of the waveform 152 causes another rise 180 of the waveform 160.

Figure 7:
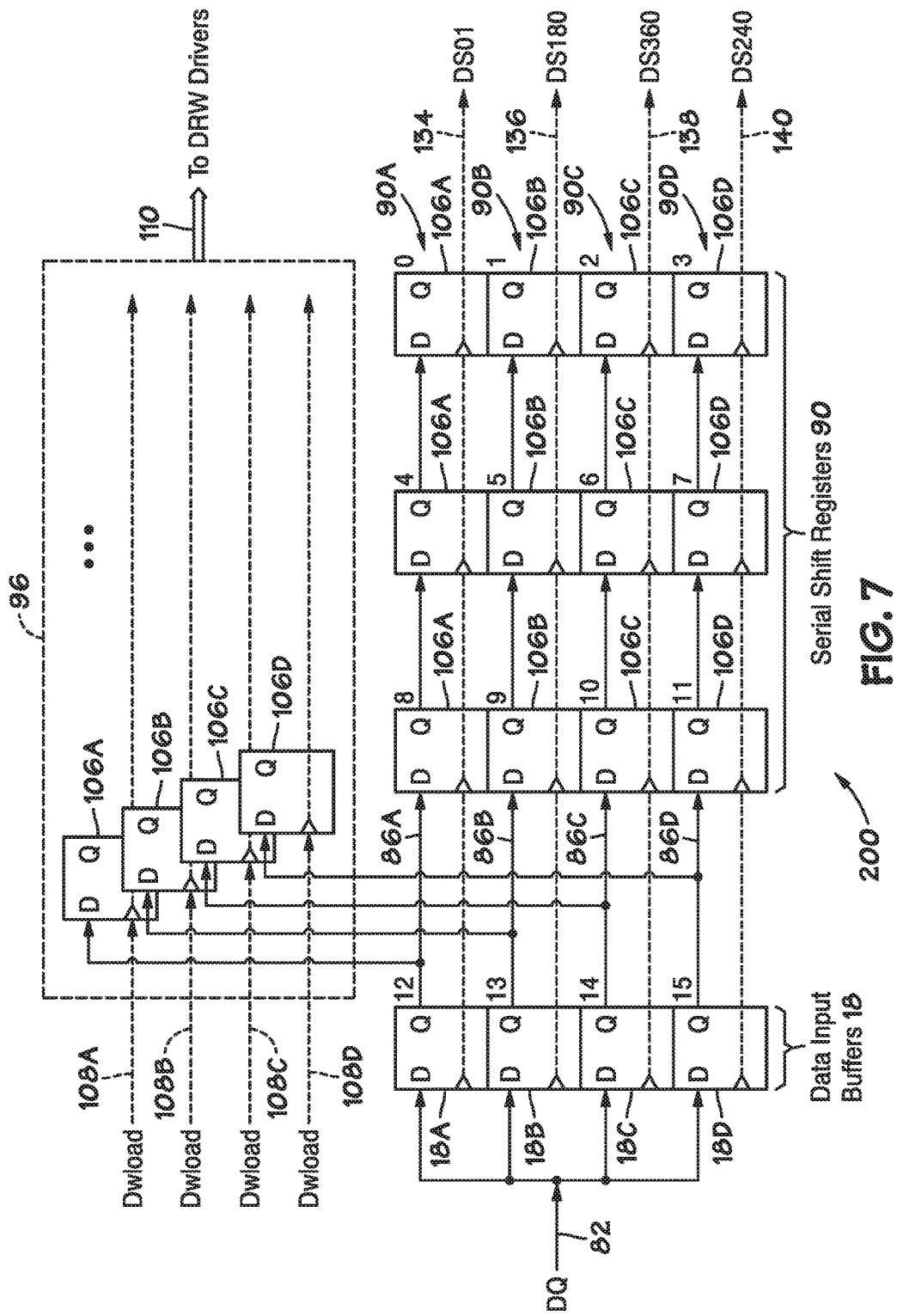
FIG. 7 is a schematic diagram of a parallelization circuit that utilizes the multiple phases of FIG. 5, in accordance with an embodiment.

FIG. 7 is a schematic diagram of multi-phase parallelization circuitry 200. The multi-phase parallelization circuitry 200 receives the DQ signal 82 and the phases 134, 136, 138, and 140 of the DQS signal 84 generated in the phase dividing circuitry 130. As illustrated, the multi-phase parallelization circuitry 200 includes a number of serial shift registers 90 corresponding to a number of phases generated in the phase dividing circuitry 130. As illustrated, the number of flip flops 120 used in the serial shift registers 90 corresponds to a burst length minus the number of phases generated in the phase dividing circuitry 130 since each phase has one bit that bypasses the serial shift registers 90. For example, when four phases are used in the memory device 10 for a 16-bit burst length, the serial shift registers 90 include 12 flip flops to implement shifting in four 3-bit serial shift registers 90.

As illustrated, the phase 134 drives an input buffer 18A to shift in data from the DQ signal 82 when the current bit of the DQ signal 82 corresponds to the phase 134. The phase 134 also drives the latches 106A to shift in the data from the input buffer 18A. Similarly, the phase 136 drives an input buffer 18B to shift in data from the DQ signal 82 when the current bit of the DQ signal 82 corresponds to the phase 136. The phase 136 also drives the latches 106B to shift in the data from the input buffer 18B. Likewise, the phase 138 drives an input buffer 18C to shift in data from the DQ signal 82 when the current bit of the DQ signal 82 corresponds to the phase 138. The phase 138 also drives the latches 106C to shift in the data from the input buffer 18C. Moreover, the phase 140 drives an input buffer 18D to shift in data from the DQ signal 82 when the current bit of the DQ signal 82 corresponds to the phase 140. The phase 140 also drives the latches 106D to shift in the data from the input buffer 18D.

Each row of flip flops 120 and the corresponding input buffer 18 may be loaded into a corresponding latch 106 of the parallel register 96 using corresponding DW loading signals 108. Specifically, a DW loading signal 108A loads data from the input buffer 18A and the latches 106A, a DW loading signal 108B loads data from the input buffer 18B and the latches 106B, a DW loading signal 108C loads data from the input buffer 18C and the latches 106C, and a DW loading signal 108D loads data from the input buffer 18D and the latches 106D. The DW loading signals 108 may each drive after a last bit of the write operation has been buffered in the corresponding input buffer 18. For example, when bit 12 has been stored in the input buffer 18A, the DW loading signal 108A may fire to transfer data from the input buffer 18A and the latches 106A to the corresponding latches 106A of the parallel register 96. Similarly, when bit 13 has been stored in the input buffer 18B, the DW loading signal 108B may fire to transfer data from the input buffer 18B and the latches 106B to the corresponding latches 106B of the parallel register 96. Also, when bit 14 has been stored in the input buffer 18C, the DW loading signal 108C may fire to transfer data from the input buffer 18C and the latches 106C to the corresponding latches 106C of the parallel register 96, and when bit 15 has been stored in the input buffer 18D, the DW loading signal 108D may fire to transfer data from the input buffer 18D and the latches 106D to the corresponding latches 106D of the parallel register 96. In some embodiments, a DW loading signal 108 may be used to load more than one serial shift register 90 to save on signal routing. The data from the parallel register 96 is transferred to the DRW drivers 110 for transmission to the memory banks 12.

Figure 8:
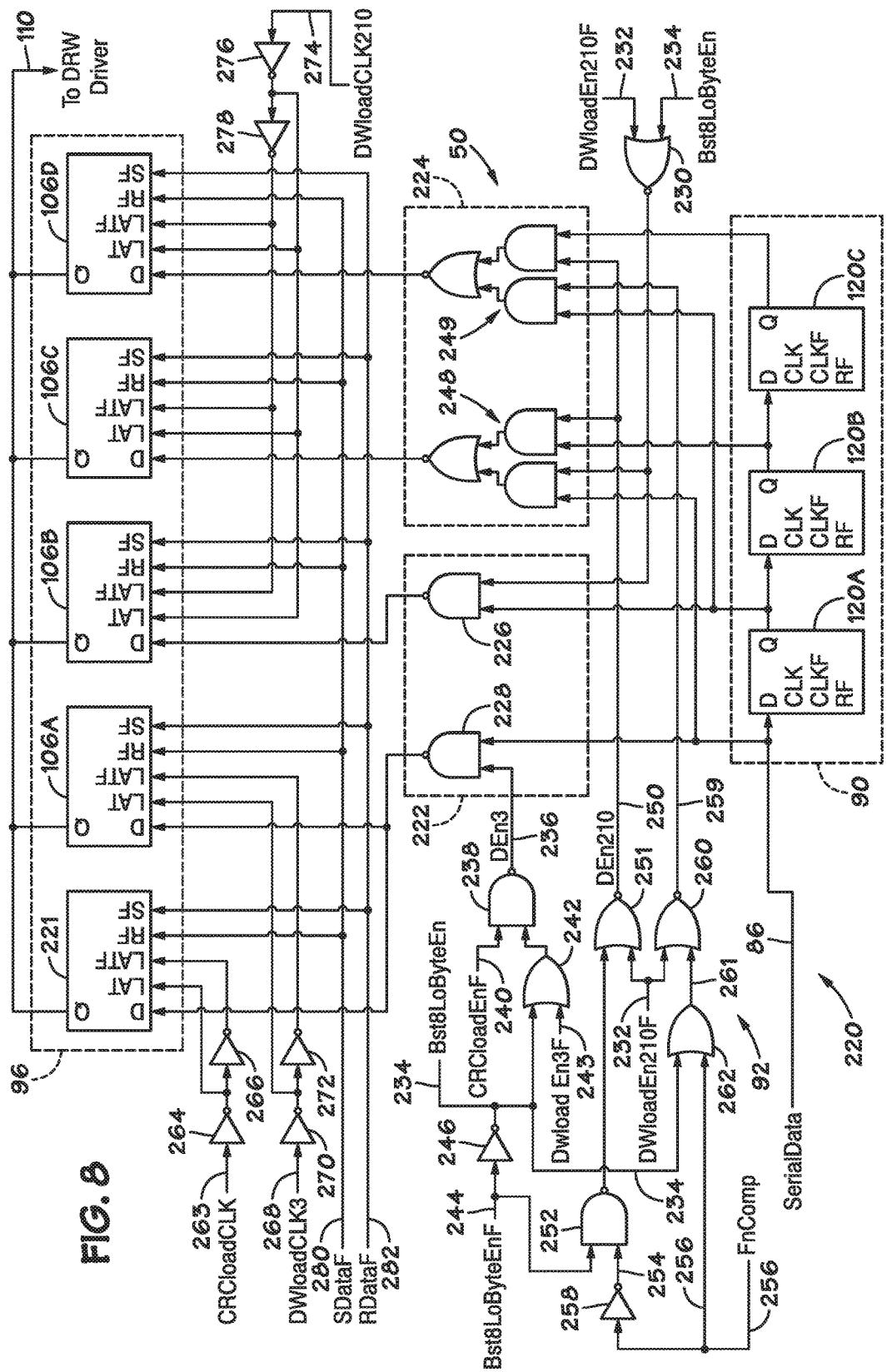
FIG. 8 is a schematic diagram of a parallelization circuit that is a part of the parallelizer of FIG. 2 that includes the serial shift register, the serial-to-parallel conversion circuitry, and the parallel register for a single phase of the parallelizer having multiple phases, in accordance with an embodiment.

FIG. 8 is a schematic diagram of an embodiment of parallelization circuitry 220 that is a part of the parallelizer 47 that includes embodiments of the serial shift register 90, the serial-to-parallel conversion circuitry 92, and the parallel register 96 for a single phase of the parallelizer 47 having multiple phases. This parallelization circuitry 220 may be repeated for each phase (e.g., 4 copies total for 4 phases). The serial shift register 90 includes 3 flip flops 120. Each parallel register 96 includes four latches 106 and a CRC latch 221 for an optional CRC bit when CRC is enabled for the parallel register 96. The gating circuitry 92 of the serial-to-parallel conversion circuitry 92 includes power gates 222 and multiplexers 224 that each blocks transmission to the parallel register 96 to reduce power consumption when data is not to be written to the parallel register 96, such as when the serial data 86 from the input buffer 18 is being shifted into the serial shift register 90.

For instance, the power gates 222 provide significant power during writes by using NAND gates 226 and 228 to block loading of the parallel register 96 while the write data bits are being shifted in the serial shift register 90. The NAND gate 226 controls whether data is passed to the latch 106B based on an output of a NOR gate 230. The NOR gate 230 receives a DWloadEn210F signal 232 that transitions low when writing to the latches 106B, 106C, and 106D is not to be enabled. The NOR gate 230 also receives a Bst8LoByteEn signal 234 that indicates whether the low bits of the parallel register are being written to due to a shortened burst length. For example, the Bst8LoByteEn signal 234 may assert high when a burst length consists of 8 bits for a write rather than a possible/standard length of 16 bits. When the DWloadEn210F signal 232 and the Bst8LoByteEn signal 234 are both low, the NAND gate 226 passes (and inverts) the bit from flip flop 120A. Otherwise, the output of the NAND gate 226 is a logic high.

The NAND gate 228 gates the serial data 86 directly from the input buffer 18 using a bit 3 data enable (DEn3) signal 236. The NAND gate 228 may pass bit 3 of serial data 86 corresponding to the latch 106A and the CRC bit corresponding to the CRC latch 221. The DEn3 signal 236 is output from a NAND gate 238. The NAND gate 238 receives a CRCloadEnF signal 240 that asserts high when CRC loading is not enabled. The NAND gate 238 also receives an output of an OR gate 242 that receives a DWloadEn3F signal 243 that transitions low when loading of the latch 106A is not to be enabled. In other words, the DEn3 signal asserts low when the latches 221 or 106A are to be loaded. In this state, the NAND gate 228 passes (and inverts) the bit in the serial data 86 from the input buffer 18. In some embodiments, the Bst8LoByteEn signal 234 may be generated locally from a complementary Bst8LoByteEnF signal 244 using an inverter 246.

The multiplexers 224 also provide gating functionality similar to the power gates 222. The multiplexers 224 also provide additional flexibility to receive low bits or high bits. For example, multiplexer 248 may select between a bit in the serial data 86 from the input buffer and a bit output from the flip flop 120B. Similarly, multiplexer 249 may select between a bit output from the flip flop 120A and a bit output from the flip flop 120C. In a default state where low bits are not selected, passage through the multiplexers 224 may be controlled using bits 210 data enable (DEn210) signal 250. The DEn210 signal 250 is generated using a NOR gate 251 that receives the DWloadEn210F signal 232 and an output of a NAND gate 252 that receives the Bst8LoByteEnF signal 244. The NAND gate 252 also receives a fnCompF signal 254 that is a logical complement to a fnComp signal 256 generated using the inverter 258. For example, the fnComp signal 256 may include a test mode used to force a reduced number (e.g., 8) bits of the burst to be on the lower byte regardless of address.

In other words, the DSEn210 signal causes the multiplexer 248 to pass the bit output from the flip flop 120B and the multiplexer 249 to pass the bit output from the flip flop 120C when low bits are not enabled using the Bst8LoByteEn signal 234 and DWloadEn210F 232 indicates that the latches 106C and 106D are to be loaded.

Moreover, the multiplexer 248 may selectively pass the bit in the serial data 86 from the input buffer 18 using a selection signal 259. Similarly, the multiplexer 249 may selectively pass the bit output from the flip flop 120A using the selection signal 259. The selection signal 259 indicates that a shorter burst length is to be used causing the multiplexers 248 and 249 to pull from earlier locations in the serial shift register 90. The selection signal 259 is generated using a NOR gate 260 that receives the DWloadEn210F signal 232 a Bst8Cmp signal 261 that forces a burst on the lower byte regardless of address (e.g., such as the test mode of the fnComp signal 256). The Bst8Cmp signal 261 is output from an OR gate 262 that receives the Bst8LoByteEn 234 and the fnComp signal 256.

As illustrated, the latches 106 of a single phase use a different clocking strobe for a bit captured directly from the input buffer 18 than a clocking strobe used for bits transferred from the flip flops 120 of the serial shift register 90. The use of a separate clocking strobe for the bit captured directly from the input buffer 18 creates a timing relaxation for the parallelization circuitry 220. Specifically, a propagation delay of the input buffer 18 may be long, thereby potentially causing the serial data 86 to arrive relatively late in a write operation. The separate clocking strobe may be delayed appropriately to match the serial data 86 propagation delay. Using a single clocking strobe for all latches 106 may create some issues. For example, during immediately consecutive write operations, the data from the first write operation is to be uploaded to the parallel register 96 from the serial shift register 90 before data from the second write operation is shifted into the serial shift register 90 to avoid data corruption. As appreciated, this window may not provide enough time to complete loading of the parallel register 96 before data for a subsequent write operation is buffered at the input buffer. Moreover, application of delay to the clocking strobe for all latches 106 to create timing flexibility may create other difficulties. For example, delaying all phase clocks to achieve permissible timing may significantly increase power consumption of the memory device 10.

Returning to FIG. 8, a CRCloadClk signal 263 may be used to latch data into the CRC latch 221. The CRCloadClk signal 263 may be passed through inverters 264 and 266 for complementary timing signals, timing matching, and/or amplification to compensate for fanout loading. Similarly, a DWloadClk3 signal 268 may be used to latch data into the latch 106A. The DWloadClk3 signal 268 may be passed through inverters 270 and 272 for complementary timing signals, timing matching, and/or amplification to compensate for fanout loading. The other latches 106B, 106C, and 106D are clocked using a DWloadClk210 signal 274. Similar to the CRCloadClk signal 263 and the DWloadClk3 268, the DWloadClk210 274 may be passed through inverters 276 and 278 for complementary timing signals, timing matching, and/or amplification to compensate for fanout loading.

Figure 9:
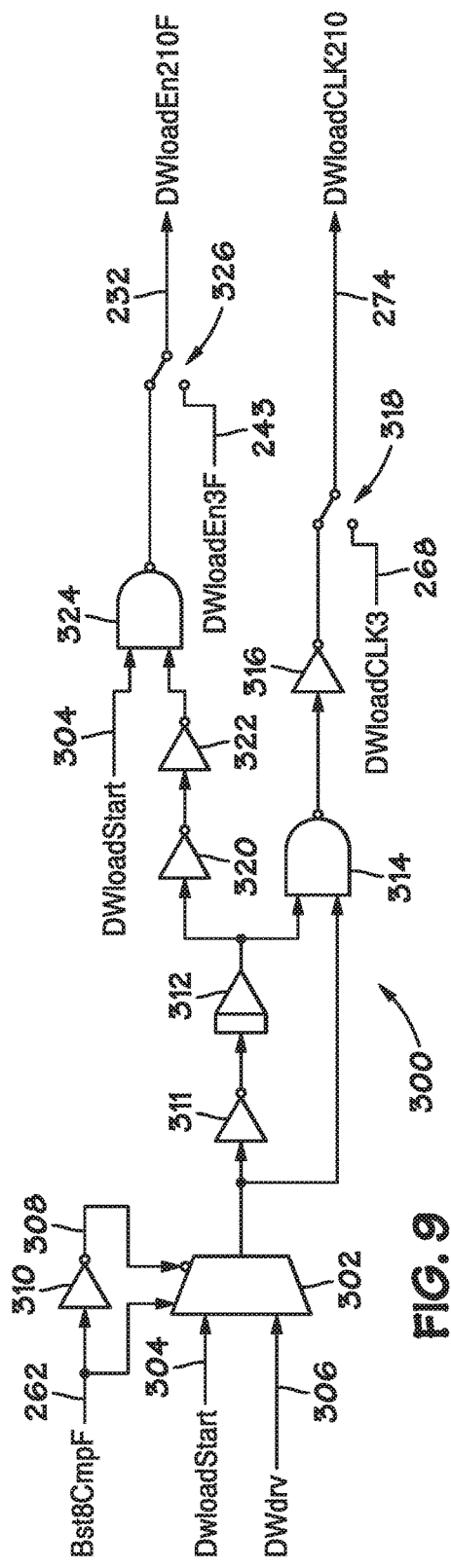
FIG. 9 is a schematic diagram of a timing chain used to generate bit control signals for bits passed through the serial shift register of FIG. 8, in accordance with an embodiment.

FIG. 9 is a schematic diagram of a timing chain 300 used to generate the DWloadEn210F signal 232 and the DWloadClk210 signal 274. The timing chain 300 includes a multiplexer 302 that receives a DWloadStart signal 304 and a DWdrv signal 306. The DWloadStart signal 304 indicates that the loading of the parallel register 96 has begun/is beginning. The DWdrv signal 306 initiates the DRW 110 being driven. It is timed to arrive at the DRW driver 110 just after the data from the parallel latch. In other words, the DWdrv signal 306 indicates when the DRW driver 110 is to be driven. The multiplexer 302 selects between the DWloadStart signal 304 and the DWdrv signal 306 using the Bst8CmpF 262 and a complementary Bst8Cmp 308 generated from the Bst8CmpF 262 using an inverter 310.

The output of the multiplexer 302 is passed to an inverter 311 and a delay 312. The amount of the delay in the delay 312 and the inverter 311 sets a width of a pulse corresponding to a duration from a pulse on DWloadClk210 signal 274 to the DWloadEn210F signal 232. The output of the multiplexer 302 and the output of the delay 312 are both passed to a NAND gate 314. The NAND gate 314 outputs a pulse due to the output of the multiplexer 302 until the output propagates through the delay 312 to close off the pulse. The output of the NAND gate 314 is passed to an inverter 316 as the DWloadClk210 signal 274 unless a switch 318 is used to select the DWloadClk3 268 as the DWloadClk210 signal 274.

The output of the delay 312 is also passed through inverters 320 and 322 and passed to a NAND gate 324 that also receives the DWloadStart signal 304. The output of the NAND gate 324 is passed as the DWloadEn210F signal 232 unless a switch 326 is used to select the DWloadEn3F 243 as the DWloadEn210F signal 232. Thus, the switches 318 and 326 enable all delays applied to bit loading latched in latch 106A from the bit captured directly from the input buffer to be applied to all of the latches 106.

Figure 10:
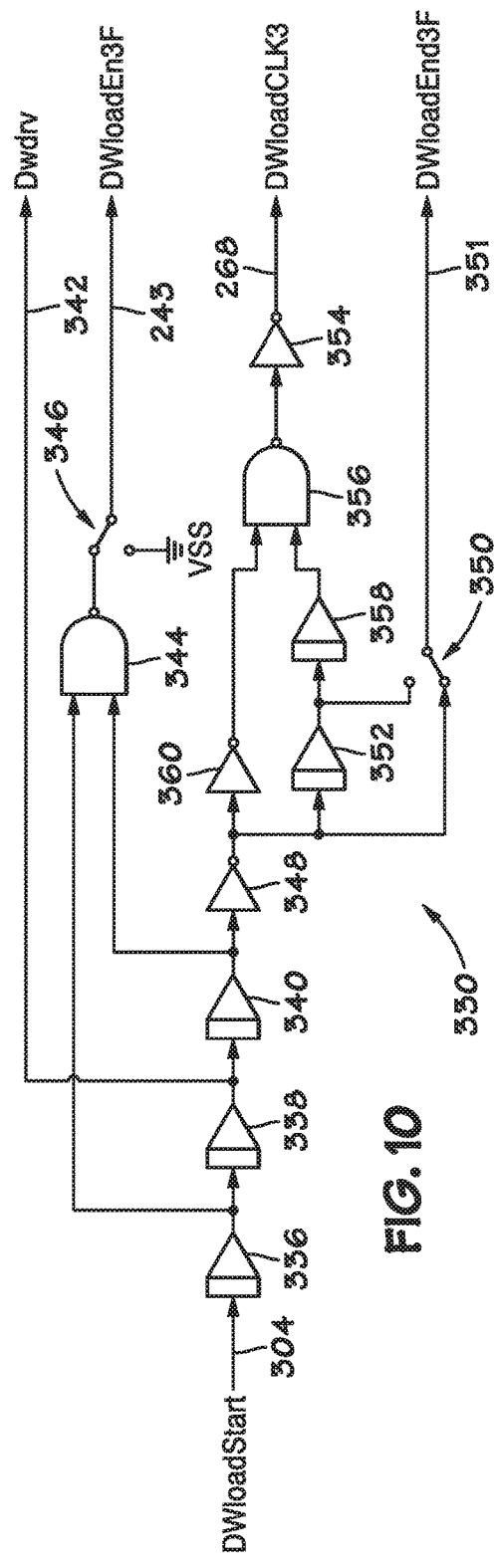
FIG. 10 is a schematic diagram of a timing chain used to generate bit control signals for a bit passed directly from an input buffer to the parallel register, in accordance with an embodiment.

FIG. 10 illustrates a schematic diagram of a timing chain 330 used to generate timing signals for the bit loaded into the latch 106A directly from the input buffer 18. The timing chain 330 receives the DWloadStart signal 304 and passes it through delays 336, 338, and 340. The delays 336, 338, and 340 may be used to delay the serial data 86 until the DEn3 signal 236 can change. In other words, the delays 336, 338, and 340 may emulate most of the delay of propagation of the DQ signal 82 through the input buffer 18. In other words, the DQ signal 82 is double buffered: once at the input buffer 18 and once using the delays 336, 338, and 340. A DWdrv signal 342 is extracted after the second delay 338. Outputs of the first delay 336 and the third delay 340 are passed to a NAND gate 344. In other words, the less-delayed signal from the first delay 336 starts a pulse on the DWloadEn3F 243, and the more-delayed signal from the third delay 340 ends the pulse on the DWloadEn3F 243. Thus, the duration of the pulse corresponds to the length of the delays 338 and 340. In some embodiments, the DWloadEn3F 243 may be coupled to VSS using a switch 346.

The output of the delay 340 may be passed to an inverter 348 that may be connected, via a switch 350, to a DWloadEnd3F 351 that indicates that the loading enable signal is ending/to end. The DWloadEnd3F 351 may also be selected to be a delayed version from the inverter 348 that is passed through a delay 352. In other words, the DWloadEnd3F 351 may be selected to bypass or include the delay 352.

The timing chain 330 may also be used to generate the DWloadClk3 268 from an inverter 354 that receives an output from a NAND gate 356. The NAND gate 356 receives a delayed version of an output of the delay 352 through a delay 358. The NAND gate 356 also receives an output from an inverter 360 that inverts an output from the inverter 348. In other words, the NAND gate 356 receives a signal and a delayed-and-inverted version of the signal to generate the DWloadClk3 268. Thus, the length of the delays 352 and 358 set a width of a pulse for the DWloadClk3 268.

Figure 11:
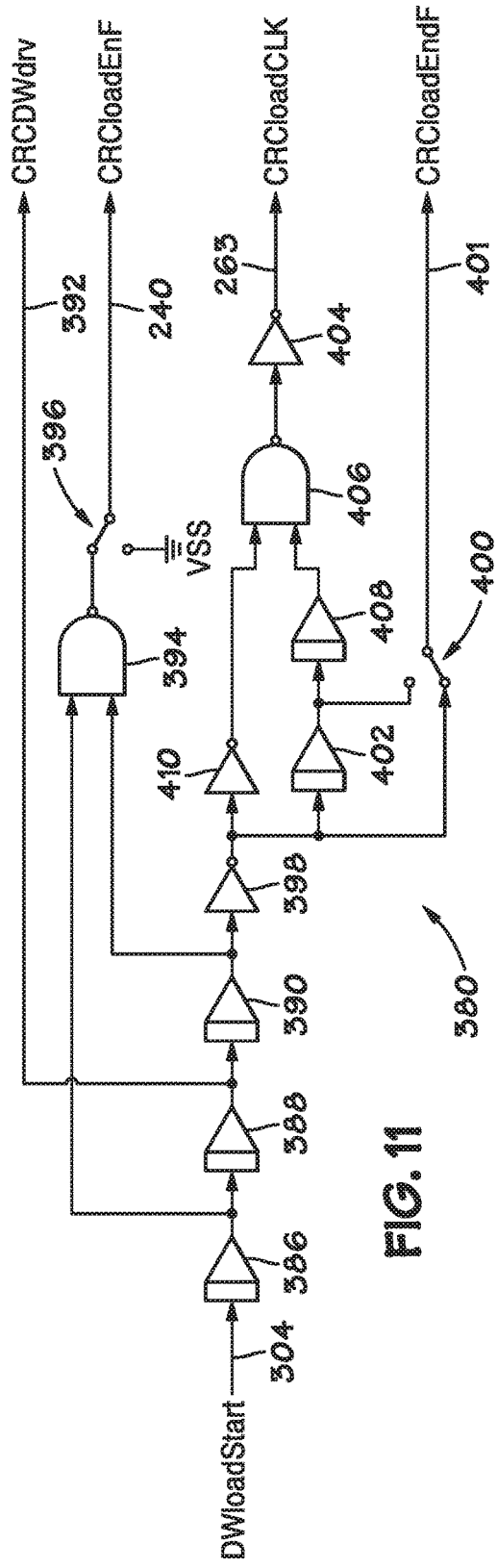
FIG. 11 is a schematic diagram of a timing chain used to generate bit control signals for a cyclic redundancy check (CRC) bit passed directly from an input buffer to a CRC latch, in accordance with an embodiment.

FIG. 11 is a schematic diagram of a timing chain 380 used to generate timing signals for the CRC bit loaded into the CRC latch 221 directly from the input buffer 18 similar to how the timing chain 330 is used to generate timing signals for the bit loaded into the latch 106A directly from the input buffer 18. Similar to how the timing chain 330 generates the DWdrv signal 342, the DWloadEn3F signal 243, the DWloadClk3 signal 268, and the DWloadEnd3F signal 351, the timing chain 380 generates a CRCDWdrv signal 392, the CRCloadEnF signal 240, the CRCloadClk signal 263, and a CRCloadEndF signal 401. In other words, the timing chain 380 works identically to the timing chain 330 although the timing chain 380 delays may include additional delays that delay latching of the CRC latch 221 until after latching of the latch 106A has latched since the CRC bit occurs in the serial data 86 after the final bit of write data for the phase corresponding to the timing chains 330 and 380.

Figure 12:
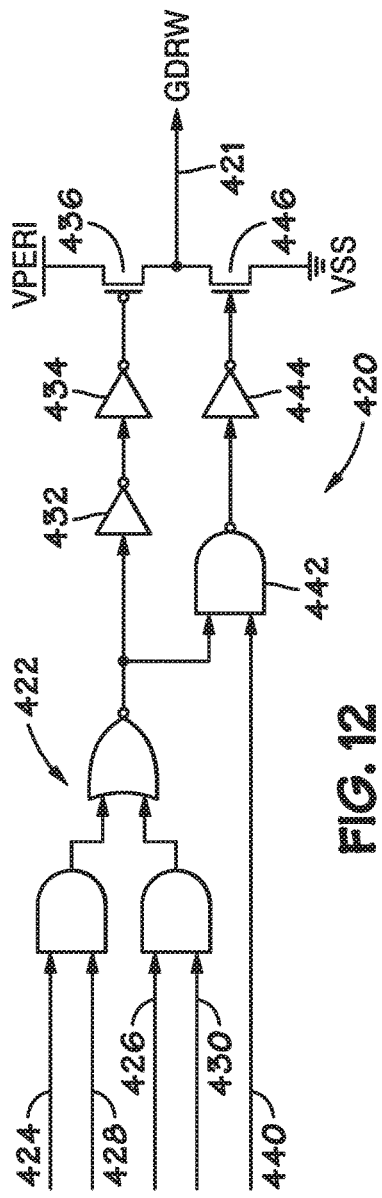
FIG. 12 is a schematic diagram for power-saving loading circuitry that may be used to drive a global data read write (GDRW) bus using data from the multiple phases, in accordance with an embodiment.

FIG. 12 is a schematic diagram of loading circuitry 420 that may be used to drive a global DRW (GDRW) bus 421 from the data from the multi-phases derived from the DRW drivers 110 via the local DRW bus. The loading circuitry 420 may exist in the memory device in multiple copies. For example, if four phases are used, two copies of the loading circuitry 421 may be implemented in the memory device 10. The GDRW bus 421 may a have large number of bits, such as 128 bits. The loading circuitry 420 includes a multiplexer 422 that selects between data of two separate phases, such as the phases 136 and 140. The selection may be made according to which phase started first. The multiplexer 422 receives enable signals 424 and 426. The enable signal 424 may indicate that a first phase, such as the phase 136, is leading the other phase, such as the phase 140. The multiplexer 422 passes data from the appropriate phase according to the enable signals 424 and 426. The output of the multiplexer 422 is passed to inverters 432 and 434. This output is used to pull up the GDRW bus 421 to a voltage (e.g., VPERI) via a transistor 436 when the output of the multiplexer 422 is a logic low.

The loading circuitry 420 also receives a timing validity signal 440 that may be used to ensure validity of timing in the loading circuitry 420. The timing validity signal 440 may be generated from the enable signals 424 and 426. For example, complements of the enable signals 424 and 426 may be passed to a NAND gate to generate the timing validity signal 440. The timing validity signal 440 and the output of the multiplexer 422 are both passed to a NAND gate 442. The output of the NAND gate 442 is passed through an inverter 444 to a transistor 446 that may be used to pull down the GDRW bus 421 to VSS when the output of the inverter 444 is a logic high. Thus, the output of the GDRW bus 421 is generated locally between VPERI and VSS using the outputs of the inverters 434 and 444 providing additional power savings over driving the data directly onto the GDRW bus 421. Thus, the transistors 436 and 446 are driven directly with inverters instead of much larger NAND and NOR gates to provide additional power savings.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
 a plurality of memory banks configured to store data;
 an input buffer configured to receive input data and output serial data;
 a serial shift register configured to shift in the serial data and to output the serial data in a parallel format as parallel data;
 a parallel register that receives the parallel data from the serial shift register and buffered data directly from the input buffer, wherein the parallel register is configured to pass the parallel data and the buffered data to a data write bus to be stored in the plurality of memory banks; and
 serial-to-parallel conversion circuitry that controls loading of the parallel register from the serial shift register and the input buffer, wherein the serial-to-parallel conversion circuitry utilizes a first loading signal to load the buffered data into the parallel register and a second loading signal to load the parallel data into the parallel register.

2. The memory device of claim 1, wherein the buffered data comprises only a last bit of the input data to be written to the plurality of memory banks.

3. The memory device of claim 1, wherein the parallel register comprises a plurality of latches of register latch that latches data from the serial-to-parallel conversion circuitry based at least in part on the second loading signal.

4. The memory device of claim 3, wherein the parallel register comprises an input buffer latch that latches a bit from the input buffer without being shifted into the serial shift register, wherein the input buffer latch latches data based at least in part on the first loading signal.

5. The memory device of claim 4, wherein the parallel register comprises a cyclic redundancy check (CRC) latch that latches a CRC bit from the input buffer based at least in part on a CRC loading signal.

6. The memory device of claim 5, wherein the CRC bit is passed from input buffer after the bit has been passed.

7. The memory device of claim 1, wherein the serial-to-parallel conversion circuitry comprises gating circuitry that selectively cuts off the data passed from the input buffer from reaching the parallel register using a plurality of enable signals.

8. The memory device of claim 7, comprising a first timing chain that generates the second loading signal, wherein the first timing chain comprises a first delay that sets a width of a first enable signal of the plurality of enable signals to pass through bits from the serial shift register through the gating circuitry.

9. The memory device of claim 8, comprising a second timing chain that generates the first loading signal, wherein the second timing chain comprises a second delay that sets a width of a second enable signal of the plurality of enable signals to pass through a bit that bypasses the serial shift register through the gating circuitry.

10. The memory device of claim 9, comprising a cyclic redundancy check (CRC) timing chain that generates a CRC loading signal, wherein the CRC timing chain comprises a CRC delay that sets a width of a CRC enable signal of the plurality of enable signals to pass through a CRC bit that bypasses the serial shift register through the gating circuitry.

11. A memory device comprising:
 a plurality of memory banks configured to store data;
 an input buffer configured to receive input data and output serial data;
 a serial shift register configured to shift in the serial data and to output the serial data in a parallel format as parallel data;
 a parallel register that receives the parallel data from the serial shift register and buffered data directly from the input buffer, wherein the parallel register is configured to pass the parallel data and the buffered data to a data write bus to be stored in the plurality of memory banks; and
 serial-to-parallel conversion circuitry comprising gating circuitry that selectively cuts off the data passed from the input buffer, the parallel data and the buffered data, from reaching the parallel register using a plurality of enable signals.

12. The memory device of claim 11, wherein the parallel register comprises a plurality of latches to latch the parallel data in the parallel register.

13. The memory device of claim 11, wherein the parallel register comprises a latch to latch the buffered data from the input buffer.

14. The memory device of claim 11, wherein parallel register comprises a cyclic redundancy check (CRC) latch to latch a CRC bit from the input buffer.

15. The memory device of claim 11, wherein the gating circuitry comprises a NAND gate that selectively cuts off the parallel data or the buffered data from the parallel register based at least in part on the plurality of enable signals.

16. The memory device of claim 11, wherein the gating circuitry comprises a multiplexer that selectively cuts off the parallel data from the parallel register based at least in part on the plurality of enable signals.

17. The memory device of claim 16, wherein the multiplexer selects between a low bit location to write to the parallel register and a high bit location to write to the parallel register based at least in part on a bit location signal.

18. A method, comprising:
 receiving, at an input buffer of a memory device, input data to be stored in a plurality of memory banks of the memory device;
 outputting serial data from the input buffer based on the input data;
 shifting a first portion of the serial data from the input buffer to a serial shift register that is configured to output the first portion of the serial data in a parallel format as parallel data;
 receiving first and second loading signals at serial-to-parallel conversion circuitry;
 controlling loading of a parallel register with the first portion and a second portion of the serial data using the serial-to-parallel conversion circuitry using the respective first and second loading signals, wherein controlling loading of the parallel register comprises:
  loading the parallel data into the parallel register using the first loading signal; and
  loading the second portion of the serial data into the parallel register from the input buffer without passing the second portion through the serial shift register.

19. The method of claim 18, wherein controlling loading of the parallel register comprises saving power consumption of the memory device by selectively blocking the first and second portions of the serial data from reaching the parallel register using a plurality of enable signals.

20. The method of claim 19, wherein selectively blocking the first and second portions of the serial data from reaching the parallel register comprises:
 applying a first enable signal of the plurality of enable signals to first gating circuitry configured to control blocking of the first portion of the serial data from a first portion of the parallel register; and
 applying a second enable signal of the plurality of enable signals to second gating circuitry configured to control blocking of the second portion of the serial data from a second portion of the parallel register.

* * * * *